US009391350B2

(12) United States Patent
Hsieh et al.

(10) Patent No.: US 9,391,350 B2
(45) Date of Patent: Jul. 12, 2016

(54) RF CHOKE DEVICE FOR INTEGRATED CIRCUITS

(71) Applicant: Taiwan Semiconductor Manufacturing Company Limited, Hsin-Chu (TW)

(72) Inventors: Jeng-Shien Hsieh, Kaohsiung (TW); Monsen Liu, Zhudong Township (TW); Chung-Hao Tsai, Huatan Township (TW); Lai Wei Chih, Hsinchu (TW); Yeh En-Hsiang, Hsinchu (TW); Chuei-Tang Wang, Taichung (TW); Chen-Hua Yu, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 475 days.

(21) Appl. No.: 13/788,537

(22) Filed: Mar. 7, 2013

(65) Prior Publication Data
US 2014/0253262 A1 Sep. 11, 2014

(51) Int. Cl.
*H01P 1/20* (2006.01)
*H03H 7/01* (2006.01)
*H01L 23/66* (2006.01)
*H01L 23/64* (2006.01)
*H01L 23/522* (2006.01)
*H01L 23/528* (2006.01)
*H03H 1/00* (2006.01)

(52) U.S. Cl.
CPC ............ *H01P 1/2007* (2013.01); *H01L 23/528* (2013.01); *H01L 23/5223* (2013.01); *H01L 23/5227* (2013.01); *H01L 23/64* (2013.01); *H01L 23/66* (2013.01); *H03H 7/0138* (2013.01); *H01L 2924/0002* (2013.01); *H03H 2001/0092* (2013.01); *Y10T 29/49117* (2015.01)

(58) Field of Classification Search
CPC ................. H03H 7/0138; H03H 3/00; H01F 2017/0093; H01P 1/20; H01P 1/2007
USPC .................................. 333/181, 182, 185, 246
See application file for complete search history.

(56) References Cited

U.S. PATENT DOCUMENTS

| | | | |
|---|---|---|---|
| 5,105,172 | A | 4/1992 | Khatibzadeh et al. |
| 5,495,217 | A * | 2/1996 | Garcia ................ H03H 7/0123 333/185 |
| 8,008,775 | B2 | 8/2011 | Lin et al. |

OTHER PUBLICATIONS

Corresponding Chinese application, Chinese Office action dated Apr. 5, 2016, 7 pages.

* cited by examiner

*Primary Examiner* — Benny Lee
*Assistant Examiner* — Albens Dieujuste
(74) *Attorney, Agent, or Firm* — Cooper Legal Group, LLC

(57) ABSTRACT

Among other things, one or more techniques and systems for selectively filtering RF signals within one or more RF frequency band are provided. In particular, an RF choke, such as a 3D RF choke or a semi-lumped RF choke, configured to selectively filter such RF signals is provided. The RF choke comprises a metal connection line configured as an inductive element for the RF choke. In an example, one or more metal lines, such as a metal open stub, are formed as capacitive elements for the RF choke. In another example, one or more through vias are formed as capacitive elements for the RF choke. In this way, the RF choke allows DC power signals to pass through the metal connection line, while impeding RF signals within the one or more RF frequency bands from passing through the metal connection line.

20 Claims, 9 Drawing Sheets

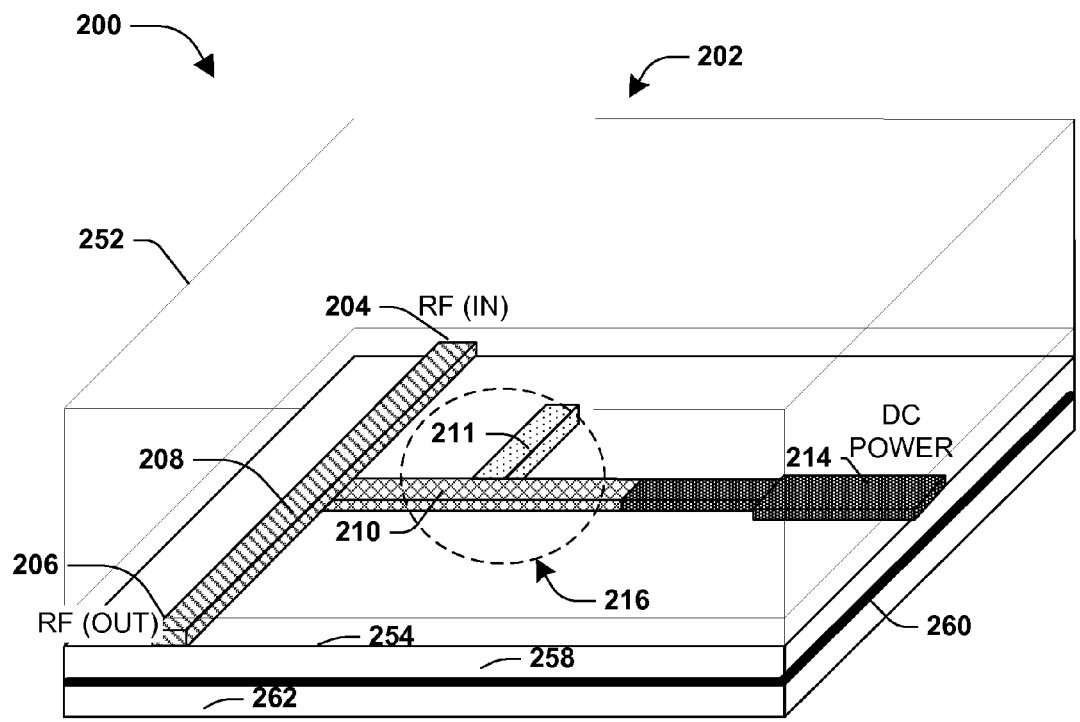
FIG. 2A
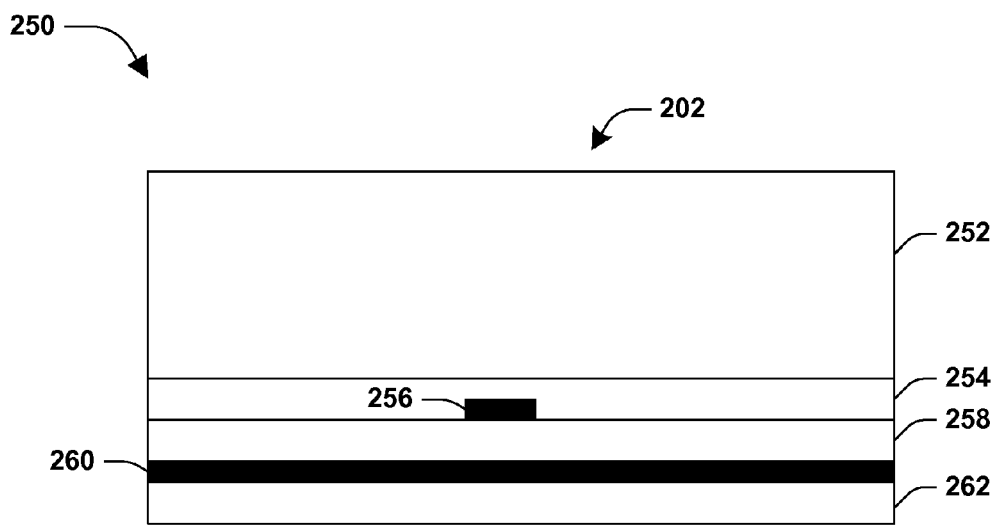

RF CHOKE DEVICE FOR INTEGRATED CIRCUITS

BACKGROUND

Many electronic devices, such as mobile communication devices, operate at various radio frequencies (RF). Such electronic devices can utilize a DC power source for operational power. An RF choke device can be used within an electronic device to provide selective electrical isolation between DC power and RF signals present within the electronic device. In an example, the RF choke device allows current associated with DC power to flow, while impeding current flow associated with a particular frequency bandwidth. Because many electronic devices comprise relatively small circuitry, an RF choke device can occupy a relatively large amount of surface area, such as 2.5 mm square area. If a wide range of frequencies are to be blocked, then multiple RF choke devices are used, such as a first RF choke device for a 10 GHz signal, a second RF choke device for a 20 GHz signal, and a third RF choke device for a 60 GHz signal, which can occupy even greater surface area than a single RF choke device.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more RF choke devices and techniques for forming such RF choke devices are provided herein. In some embodiments, an RF choke for selectively filtering an RF frequency bandwidth, such as an RF signal within an integrated circuit, is provided. The RF choke comprises a metal connection line, such as a post passivation interconnection (PPI) connection line, configured as an inductive element for the RF choke. In an example, the metal connection line corresponds to at least one of a redistribution layer or an interconnect metal layer formed within one or more dielectric layers over a passivation layer, such as a composite layer of silicon oxide, silicon nitride, PBO, BCB, or other dielectric material. The metal connection line connects to a DC power source at a first location of the metal connection line. The DC power source provides DC power signals that are carried along the metal connection line to circuitry powered by the DC power source. The metal connection line connects to a metal RF line, such as a PPI RF line, at a second location of the metal connection line. The metal RF line carries RF signals from an RF input port to an RF output port. The RF choke comprises a metal open stub, such as a PPI open stub, configured as a capacitive element for the RF choke. The metal open stub connects to the metal connection line at a third location of the metal connection line between the first location and the second location. The inductive element and the capacitive element are configured such that DC power signals from the DC power source can pass through the metal connection line, while RF signals within the RF frequency bandwidth are impeded from passing through the metal connection line. For example, the inductive element allows current to flow to circuitry powered by the DC power source, while the capacitive element impedes RF signals.

In some embodiments, a 3D RF choke for selectively filtering an RF frequency bandwidth, such as an RF signal within an integrated circuit, is provided. The 3D RF choke comprises a metal connection line, such as a PPI connection line, configured as an inductive element. The metal connection line connects to a DC power source at a first location of the metal connection line. The DC power source provides DC power signals that are carried along the metal connection line to circuitry powered by the DC power source. The metal connection line connects to a metal RF line, such as a PPI RF line, at a second location of the metal connection line. The metal RF line carries RF signals from an RF input port to an RF output port. The 3D RF choke comprises one or more through vias configured as capacitive elements. In an example, the 3D RF choke comprises a first through via comprising a signal via portion and a ground via portion. The ground via portion is connected to a ground point. In an example, RF signals within the RF frequency bandwidth are grounded through the ground via portion. The signal via portion is connected to the metal connection line at a third location of the metal connection line. In this way, the inductive element and the one or more capacitive elements are configured such that DC power signals from the DC power source can pass through the metal connection line, while RF signals within the RF frequency bandwidth are impeded from passing through the metal connection line.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DESCRIPTION OF THE DRAWINGS

FIG. 2A is an illustration of an RF choke device, according to some embodiments.

FIG. 2B is a cross-sectional view of an RF choke device, according to some embodiments.

DETAILED DESCRIPTION

Figure 1:
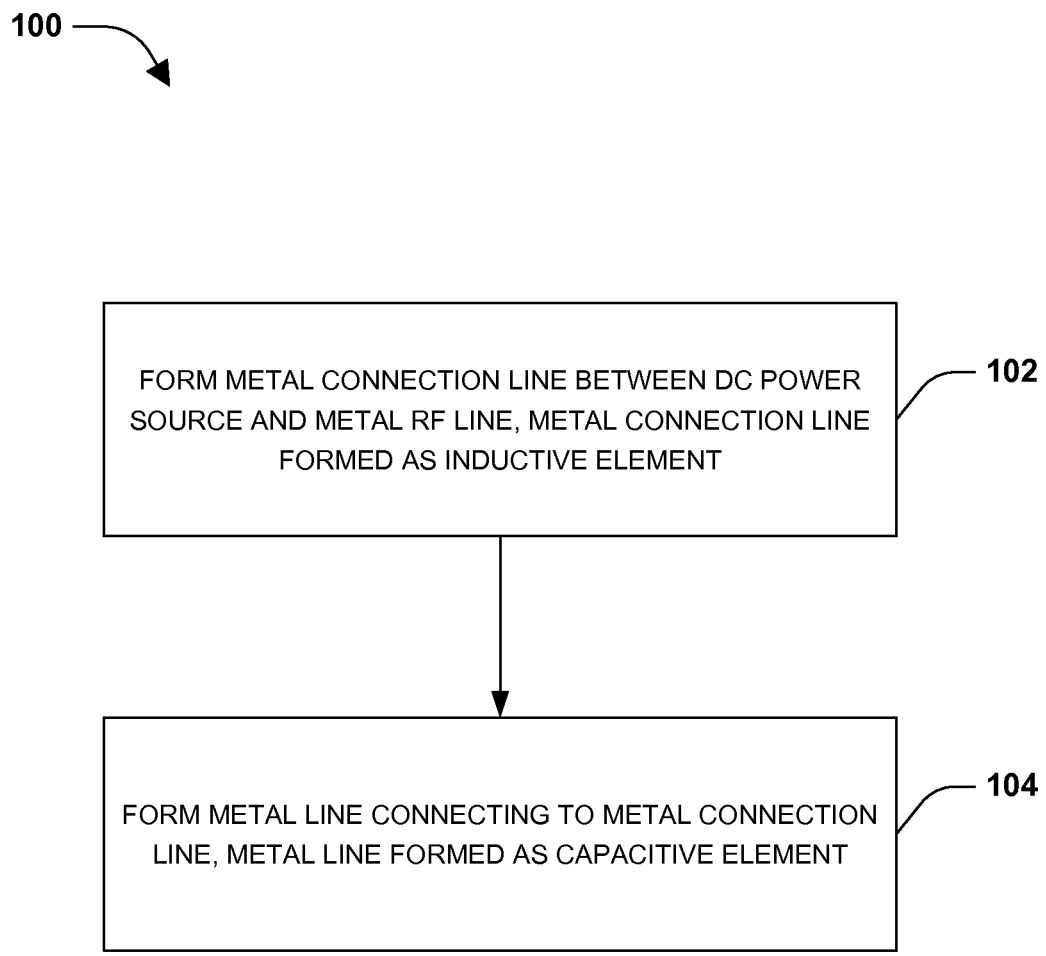
FIG. 1 is a flow diagram illustrating a method of forming an RF choke device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

A method 100 of forming an RF choke, according to some embodiments, is illustrated in FIG. 1, and RF chokes formed by such a methodology are illustrated in FIGS. 2A-8. In some embodiments, an RF choke 216 in example 200 of FIG. 2A is formed within an integrated circuit 202. The integrated circuit 202 comprises a metal RF line 208, such as a post passivation interconnection (PPI) RF line, that is connected to an RF input port 204 and an RF output port 206. The metal RF line 208 is configured to carry RF signals from the RF input port 204 to the RF output port 206, such that the RF signals are routed through the RF output port 206 to other circuitry or modules, not illustrated, within the integrated circuit 202. The integrated circuit 202 is powered by a DC power source 214, such as from current of DC power signals from the DC power source 214.

At 102, a metal connection line 210, such as a PPI connection line, is formed between the DC power source 214 at a first location of the metal connection line 210 and the metal RF line 208 at a second location of the metal connection line 210. The RF choke 216 is configured to pass DC power signals from the DC power source 214, along the metal connection line 210, to other circuitry or modules, while impeding RF signals from the metal RF connection line 208 that are within one or more frequency bandwidths. The metal connection line 210 is formed as an inductive element for the RF choke 216. In some embodiments, the metal connection line 210 has a size between about a sixth of a wavelength, associated with a lithography process used to create the integrated circuit 202, and about a twelfth of the wavelength, such that the RF choke 216 comprises a relatively small area within the integrated circuit 202.

In some embodiments, the integrated circuit 202 comprises one or more layers, as illustrated in example 200 of FIG. 2A and example 250 of FIG. 2B. For example, the integrated circuit 202 comprises a first passivation layer 262, such as a polymer layer. A first PPI layer 260 is formed on top of the first passivation layer 262. The first PPI layer 260 is configured as a ground plane. A second passivation layer 258 is formed on top of the first PPI layer 260. A third passivation layer 254 is formed on top of the second passivation layer 258. A metal line 256, such as metal RF line 208 or the metal connection line 210, is formed within the third passivation layer 254. In an example, the metal line 256 comprises a PPI line. A substrate 252 is formed on top of the third passivation layer 254. The substrate 252 comprises glass or silicon interposer, a molding compound, or other substrate material.

Figure 3:
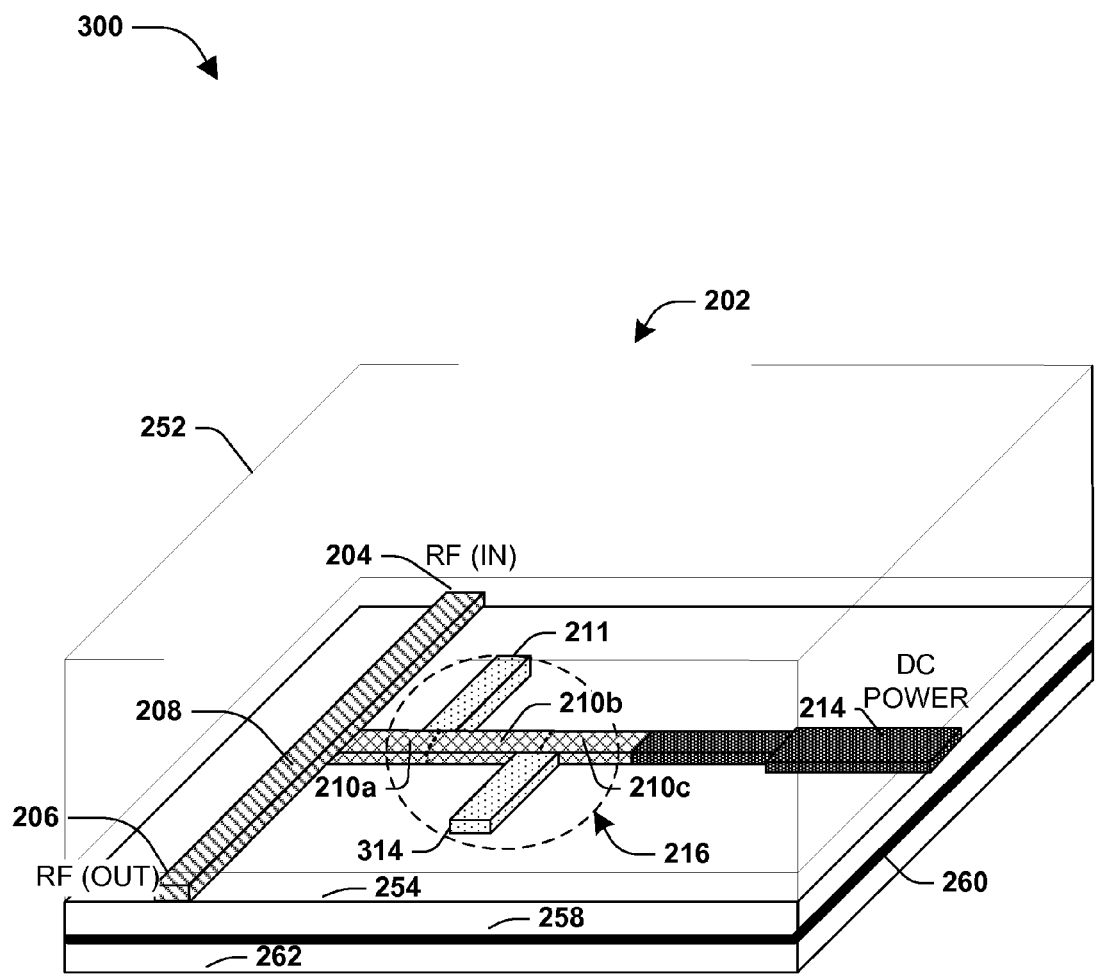
FIG. 3 is an illustration of an RF choke device, according to some embodiments.

In some embodiments, the metal connection line 210 comprises one or more metal connection line portions, as illustrated by example 300 of FIG. 3. In an example, the metal connection line 210 comprises a first metal connection line portion 210a and a second metal connection line portion 210b. The first metal connection line portion 210a is connected to the second metal connection line portion 210b at a third location along the metal connection line 210. The first metal connection line portion 210a is connected to the metal RF line 208 at the second location. In another example, the metal connection line 210 comprises a third metal connection line portion 210c that connects to the second metal connection line portion 210b at a fourth location of the metal connection line 210, such as a location at which a second metal open stub 314, such as a second PPI open stub, is formed as a capacitive element for the RF choke 216. In this way, the metal connection line 210 can comprise one or more connection line portions that are configured as inductive elements for the RF choke 216.

At 104, a metal line, such as a metal open stub 211, is formed within the RF choke 216, as illustrated by example 200 of FIG. 2A and example 300 FIG. 3. In some embodiments, the metal open stub 211 comprises a PPI open stub. For example, the metal open stub 211 is connected to the metal connection line 210 at the third location, between the first location and the second location, along the metal connection line 210. The metal open stub 211 is formed as a capacitive element for the RF choke 216. In some embodiments, the metal open stub 211 has a size between about a sixth of a wavelength, associated with a lithography process used to create the integrated circuit 202, and about a twelfth of the wavelength, such that the RF choke 216 comprises a relatively small area within the integrated circuit 202. In this way, the RF choke 216 is formed, such as on the substrate layer 252 of the integrated circuit 202. In some embodiments, the RF choke 216 is configured to selectively filter RF signals within one or more RF frequency bandwidths, such as at least one of a first RF frequency bandwidth corresponding to 10 GHz, a second RF frequency bandwidth corresponding to 20 GHz, or a third RF frequency bandwidth corresponding to 60 GHz. In this way, the RF choke 216 selectively filters RF signals based upon various parameters associated with the capacitive element, the inductive element, an impedance of the metal connection line 210, an impedance of the metal open stub 211, etc.

It is to be appreciated that a variety of configurations for one or more capacitive elements of the RF choke 216 are contemplated. In some embodiments, the RF choke 216 of example 200 of FIG. 2A and example 300 of FIG. 3 is configured as a semi-lumped design based upon the metal open stub 211 being configured as a lump capacitor. In some embodiments, the RF choke 216 comprises one or more capacitive elements, such as the metal open stub 211 and the second metal open stub 314 of example 300 of FIG. 3. In some embodiments, the RF choke comprises a 3D RF choke 404 comprising one or more vertical capacitive elements, such as through vias, as illustrated in FIGS. 4A-8.

Figure 4A:
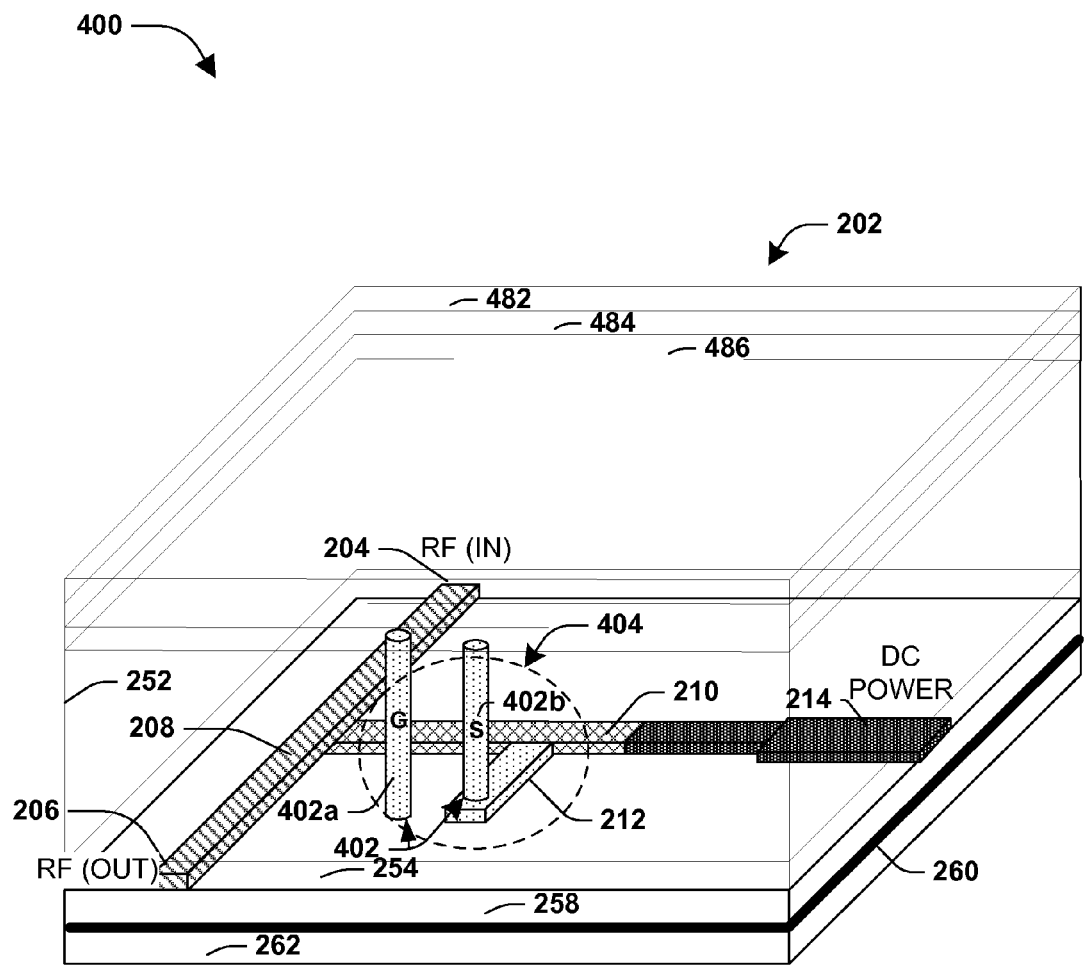
FIG. 4A is an illustration of a 3D RF choke device, according to some embodiments.

In some embodiments of the 3D RF choke 404, the 3D RF choke 404 of example 400 of FIG. 4A comprises a first through via 402 that is formed within the integrated circuit 202, such as through at least one of one or more polymer layers or one or more substrate layers of the integrated circuit 202. The first through via 402 comprises a signal via portion 402b and a ground via portion 402a. The ground via portion 402a is connected to a ground point, such as the first PPI layer 260. The signal via portion 402b is connected to a metal line 212, such as a PPI line, configured as a capacitive element for the 3D RF choke 404, which is connected to the metal connection line 210. In another embodiment, the signal via portion 402b is connected to the metal connection line 210 as opposed to the metal line 212, as illustrated in example 450 of FIG. 4B. In this way, at least one of the first through via 402 or the metal line 212 are configured as capacitive elements for the 3D RF choke 404, and the metal connection line 210 is configured as an inductive element for the 3D RF choke 404. For example, at least one of a height value, a pitch value, or a diameter value are specified for the first through via 402 based upon an impedance control factor for the capacitive element, such that the first through via 402 facilitates impeding RF signals within one or more RF frequency bandwidths while allowing DC power signals to flow through the metal connection line 210 to other circuitry or modules. One or more configuration values, such as a width value, for the metal connection line 210 are specified based upon an impedance control factor for the inductive element, such that the metal connection line 210 facilitates impeding RF signals within one or more RF frequency bandwidths while allowing DC power signals to flow through the metal connection line 210 to other circuitry or modules.

Figure 4B:
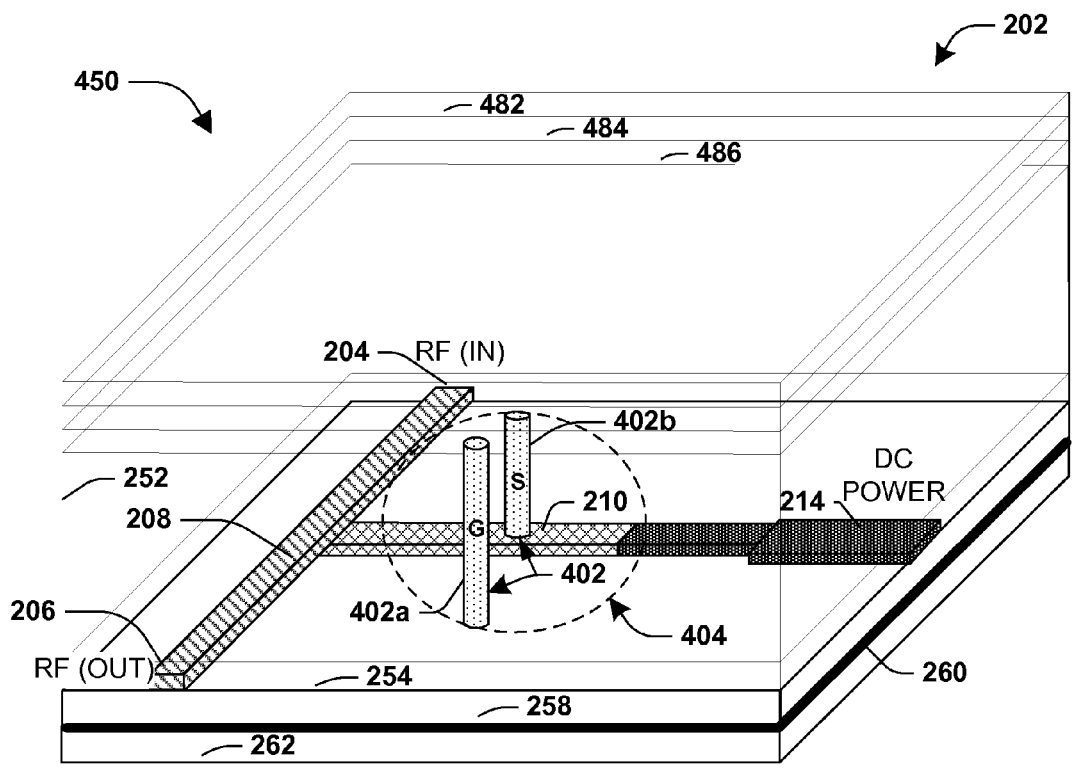
FIG. 4B is an illustration of a 3D RF choke device, according to some embodiments.
Figure 4C:
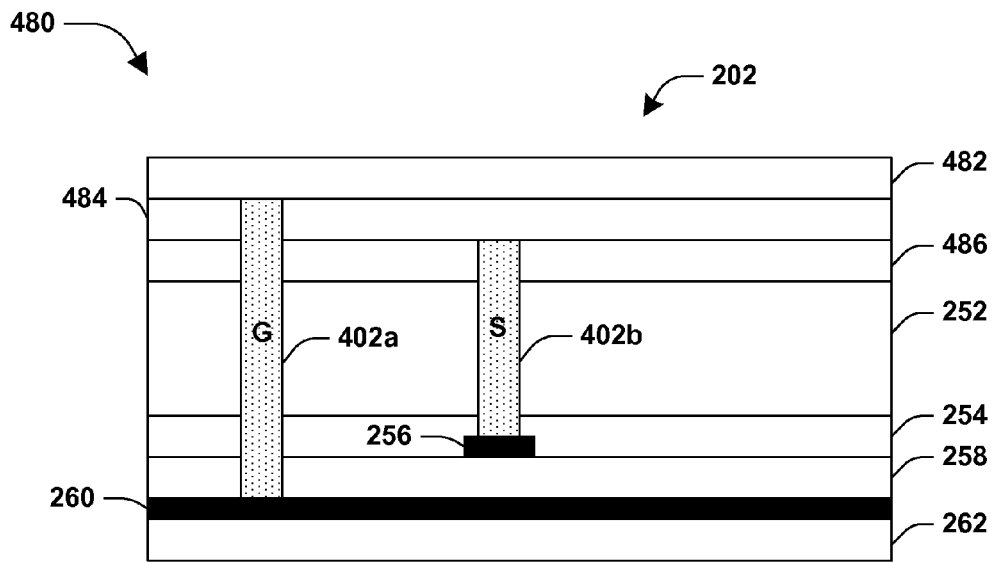
FIG. 4C is a cross-sectional view of a 3D RF choke device, according to some embodiments.
Figure 5:
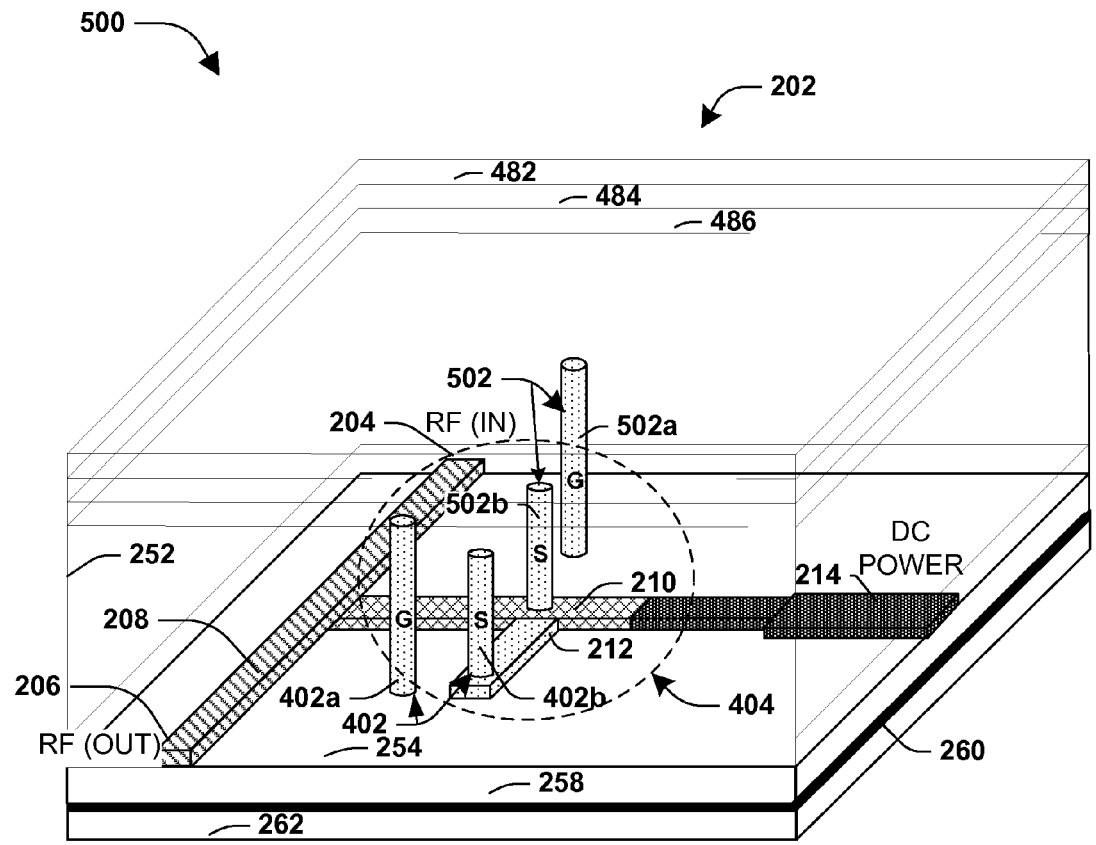
FIG. 5 is an illustration of a 3D RF choke device, according to some embodiments.

In some embodiments, the integrated circuit 202 comprises one or more layers formed on top of the substrate 252, as illustrated in example 400 of FIG. 4A, example 450 of FIG. 4B, and example 480 of FIG. 4C. For example, the integrated circuit 202 comprises a fourth passivation layer 486 formed on top of the substrate 252. The signal via portion 402b connects between the fourth passivation layer 486 and the metal line 256, such as the metal connection line 210 or the metal line 212. A fifth passivation layer 484 is formed on top of the fourth passivation layer 486. The ground via portion 402a connects between the first PPI layer 260, configured as the ground plane, and the fifth passivation layer 484. A sixth passivation layer 482 is formed on top of the fifth passivation layer 484.

In an example, a 3D RF choke can comprise one or more through vias configured as capacitive elements for the 3D RF choke. In some embodiments of the 3D RF choke 404, the 3D RF choke 404 of example 500 of FIG. 5 comprises the first through via 402 and a second through via 502. The first through via 402 comprises the signal via portion 402b and the ground via portion 402a. The second through via 502 comprises a second signal via portion 502b and a second ground via portion 502a. The second ground via portion 502a is connected to a second ground point. In an example, the second signal via portion 502b is connected to the metal connection line 210. The first through via 402 is configured as a first capacitive element for the 3D RF choke 404, and the second through via 502 is configured as a second capacitive element for the 3D RF choke 404. In this way, the 3D RF choke 404 comprises the first through via 402, the second through via 502, and the metal line 212 as capacitive elements, and comprises the metal connection line 210 as an inductive element.

Figure 6A:
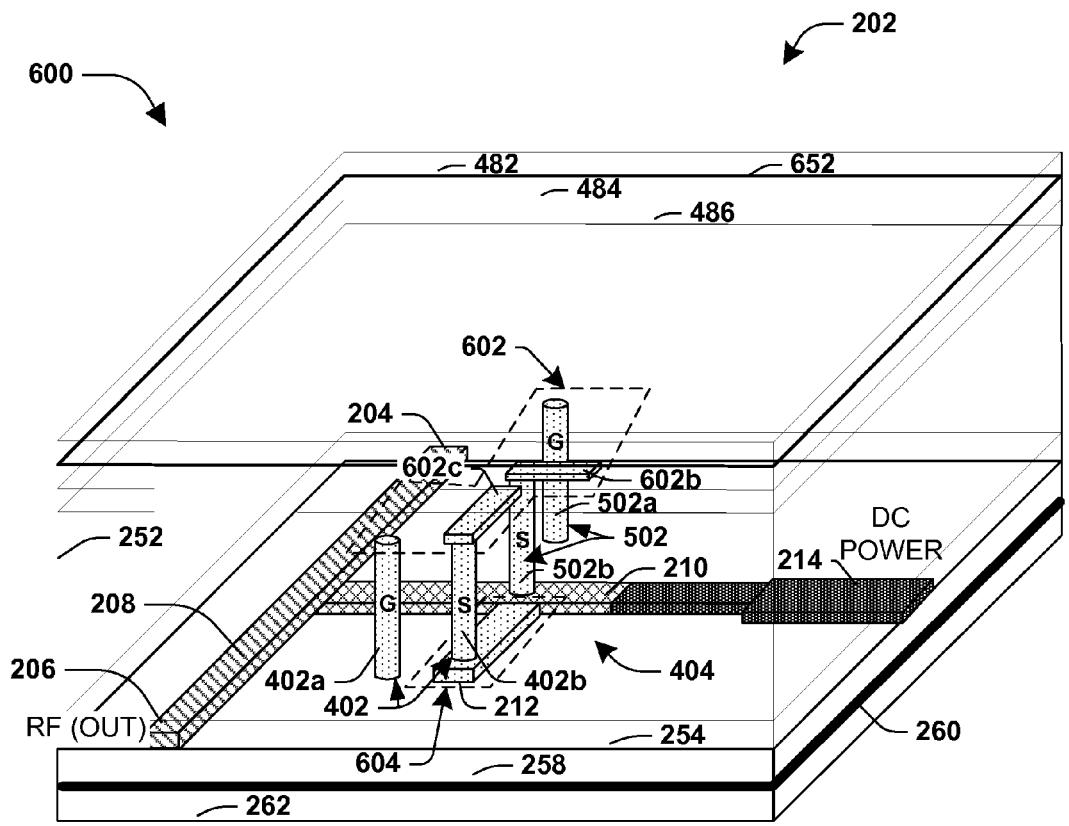
FIG. 6A is an illustration of a 3D RF choke device, according to some embodiments.

In an example, a 3D RF choke can comprise one or more PPI layers used to connect one or more through vias. In some embodiments of the 3D RF choke 404, a third PPI layer 604 of example 600 of FIG. 6A is formed underneath the first through via 402. In an example, the third PPI layer 604 comprises the metal line 212. A fourth PPI layer 602 is formed above the first through via 402. In an example, the fourth PPI layer 602 comprises a first metal line 602b connected to a top portion of the second signal via portion 502b and a second metal line 602c connected to a top portion of the signal via portion 402b. In this way, the first through via 402, the second through via 502, and one or more metal lines, such as the metal line 212, the first metal line 602b and the second metal line 602c, are configured as capacitive elements for the 3D RF choke 404.

Figure 6B:
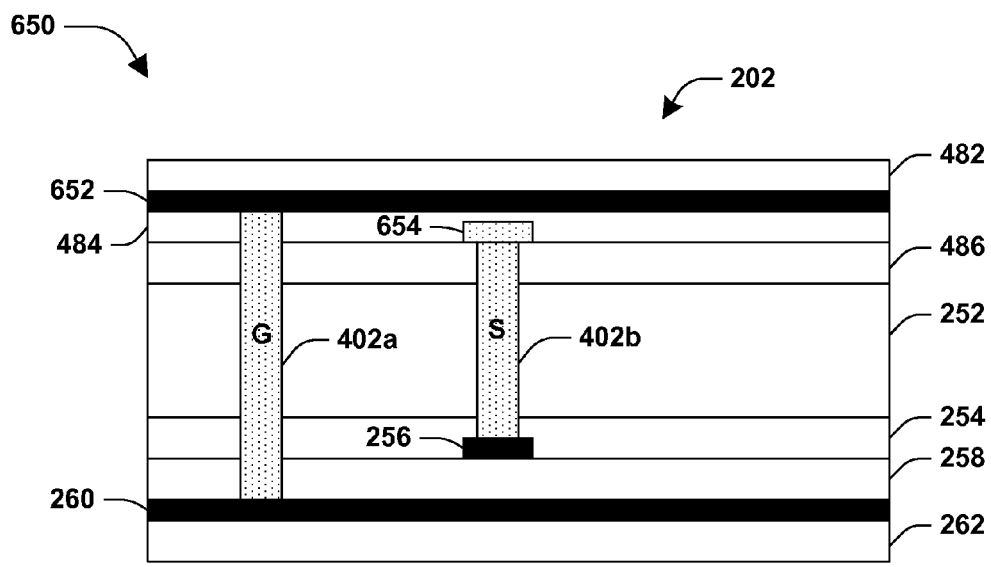
FIG. 6B is a cross-sectional view of a 3D RF choke device, according to some embodiments.

In some embodiments, the integrated circuit 202 comprises one or more additional layers formed on top of the substrate 252, as illustrated in example 600 of FIG. 6A and example 650 of FIG. 6B. For example, the integrated circuit 202 comprises a second PPI layer 652 formed between the fifth passivation layer 484 and the sixth passivation layer 482. The second PPI layer 652 is configured as a ground plane. The ground via portion 402a and the ground via portion 502a are connected between the first PPI layer 260 and the second PPI layer 652. The signal via portion 402b and the signal via portion 502b are connected between the metal line 256, such as the metal connection line 210 or the metal line 212, and a second metal line 654, such as the first metal line 602b or the second metal line 602c. In an example, the metal line 256 comprises a first PPI line and the second metal line 654 comprises a second PPI line.

Figure 7:
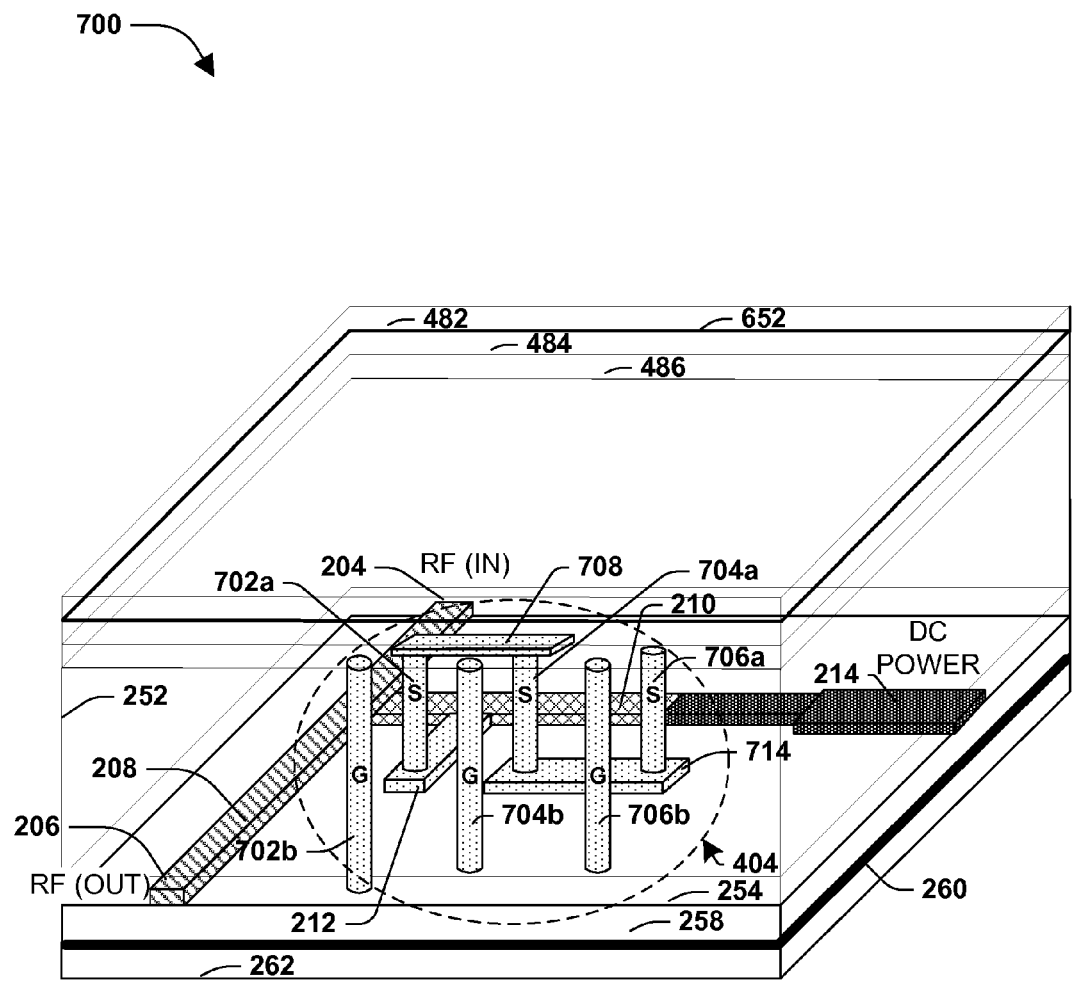
FIG. 7 is an illustration of a 3D RF choke device formed according to a meander structure, according to some embodiments.

In some embodiments of the 3D RF choke 404, the 3D RF choke 404 of example 700 of FIG. 7 is formed according to a meander structure. In an example of the meander structure, the 3D RF choke 404 comprises the metal connection line 210 configured as an inductive element for the 3D RF choke 404. The 3D RF choke 404 comprises a first signal via portion 702a, a second signal via portion 704a, and a third signal via portion 706a configured as capacitive elements of the 3D RF choke 404. The 3D RF choke 404 comprises a first ground via portion 702b, a second ground via portion 704b, and a third ground via portion 706b configured as capacitive elements for the 3D RF choke 404. The 3D RF choke 404 comprises a fourth PPI layer comprising a first metal line 708 connecting the first signal via portion 702a and the second signal via portion 704a. The 3D RF choke 404 comprises a third PPI layer comprising a second metal line 714 connecting the second signal via portion 704a to the third signal via portion 706a. The third PPI layer comprises the metal line 212 connecting the first signal via portion 702a to the metal connection line 210. In an example, the third PPI layer and the fourth PPI layer are configured as capacitive elements for the 3D RF choke 404. In an example, the first ground via portion 702b, the second ground via portion 704b, and the fourth ground via portion 706b are connected between the first PPI layer 260 and the second PPI layer 652. In this way, the 3D RF choke 404 is formed according to a meander structure.

Figure 8:
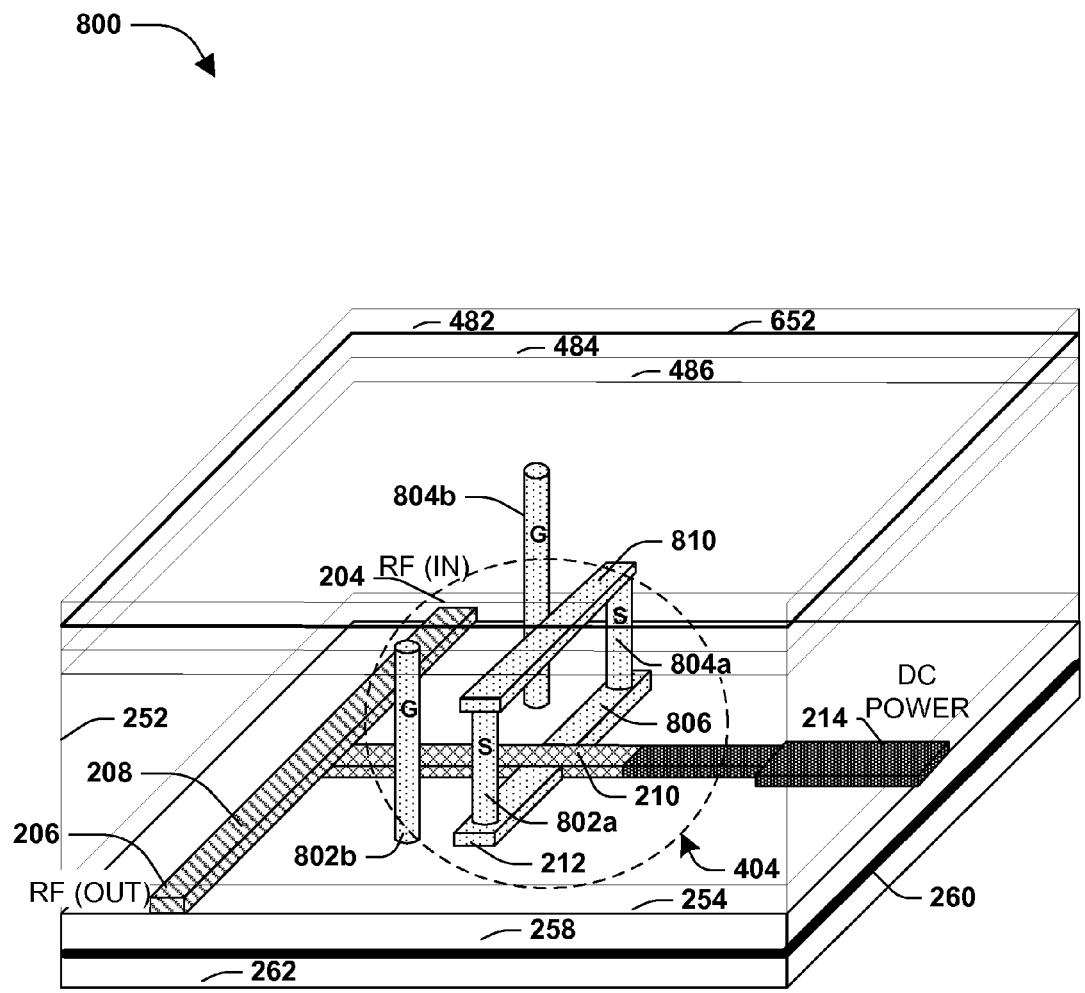
FIG. 8 is an illustration of a 3D RF choke device formed according to a vertical ring structure, according to some embodiments.

In some embodiments of the 3D RF choke 404, the 3D RF choke 404 of example 800 of FIG. 8 is formed according to a vertical ring structure. In an example of the vertical ring structure, the 3D RF choke 404 comprises the metal connection line 210 configured as an inductive element for the 3D RF choke 404. The 3D RF choke 404 comprises a first signal via portion 802a and a second signal via portion 804a configured as capacitive elements of the 3D RD choke 404. The RF choke 404 comprises a first ground via portion 802b and a second ground via portion 804b configured as capacitive elements for the 3D RF choke 404. The 3D RF choke 404 comprises a fourth PPI layer comprising a first metal line 810 connecting the first signal via portion 802a and the second signal via portion 804a. The 3D RF choke 404 comprises a third PPI layer comprising the metal line 212 connecting the first signal via portion 802a to the metal connection line 210. The third PPI layer comprises a second metal line 806 connecting the second signal via portion 804a to the metal connection line 210. In an example, the third PPI layer and the fourth PPI layer are configured as capacitive elements for the 3D RF choke 404. In an example, the first ground via portion 802b and the second ground via portion 804b are connected between the first PPI layer 260 and the second PPI layer 652. In this way, the 3D RF choke 404 is formed according to a vertical ring structure corresponding to the first signal via portion 802a, the second signal via portion 804a, the metal line 212, the first metal line 810, and the second metal line 806.

According to an aspect of the instant disclosure, a system for selectively filtering an RF frequency bandwidth is provided. The system comprises an RF choke configured to filter one or more frequency bandwidths, such as RF signals associated with an integrated circuit. The RF choke comprises a metal connection line, such as a post passivation interconnection (PPI) connection line, configured as an inductive element for the RF choke. The metal connection line connects to a DC power source at a first location of the metal connection line, such that DC power signals are carried by the metal connection line. The metal connection line is connected to a metal RF line, such as a PPI RF line, at a second location of the metal connection line. The metal RF line connects an RF input port to an RF output port, such that the metal RF line carries RF signals. The RF choke comprises a metal open stub, such as a PPI open stub, configured as a capacitive element for the RF choke. The metal open stub connects to the metal connection line at a third location of the metal connection line between the first location and the second location. Various parameters, such as impedance values, capacitance values, inductance value, and other values are specified for the inductive element and the capacitive element of the RF choke so that the RF choke passes DC power signals, but impedes RF signals within one or more frequency bandwidths.

According to an aspect of the instant disclosure, a system for selectively filtering an RF frequency bandwidth is provided. The system comprises a 3D RF choke configured to filter one or more frequency bandwidths, such as RF signals associated with an integrated circuit. The 3D RF choke comprises a metal connection line, such as a post passivation interconnection (PPI) connection line, configured as an inductive element for the 3D RF choke. The metal connection line connects to a DC power source at a first location of the metal connection line, such that DC power signals are carried by the metal connection line. The metal connection line is connected to a metal RF line, such as a PPI RF line, at a second location of the metal connection line. The metal RF line connects an RF input port to an RF output port, such that the metal RF line carries RF signals. The 3D RF choke comprises one or more through vias, such as a first through via, configured as capacitive elements for the 3D RF choke. The first through via comprises a signal via portion and a ground via portion. The ground via portion is connected to a ground point. The signal via portion is connected to the metal connection line at a third location of the metal connection line. Various parameters, such as impedance values, capacitance values, inductance values, width values, height values, diameter values, pitch values, and other values are specified for the inductive elements and the capacitive elements of the 3D RF choke so that the 3D RF choke passes DC power signals, but impedes RF signals within one or more frequency bandwidths.

According to an aspect of the instant disclosure, a method for forming an RF choke, such as a 3D RF choke or a semi-lumped RF choke, is provided. The method comprises, forming a metal connection line, such as a post passivation interconnection (PPI) connection line, between a DC power source at a first location of the metal connection line and a metal RF line, such as a PPI RF line, at a second location of the metal connection line. The metal connection line is formed as an inductive element for the RF choke. In some embodiments, a metal line, such as a metal open stub, connecting to the metal connection line at a third location of the metal connection line between the first location and the second location is formed. The metal line, such as a PPI line, is formed as a capacitive element for the RF choke. In some embodiments, one or more through vias are formed as capacitive elements for the RF choke. In some embodiments, one or more PPI layers are formed above or underneath the one or more through vias, such that a first through via connects to a second through via by at least one PPI layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system for selectively filtering a radio frequency (RF) bandwidth, comprising:
   a 3D RF choke configured to selectively filter the RF bandwidth, the 3D RF choke comprising:
      a metal RF line connecting an RF input port to an RF output port;
      a metal connection line connecting to a DC power source at a first location and connecting to the metal RF line at a second location; and
      a first signal through via connected to the metal connection line at a third location, the third location between the first location and the second location.

2. The system of claim 1, comprising:
   a metal line connected to the metal connection line at the third location and the first signal through via indirectly connected to the metal connection line at the third location through the metal line.

3. The system of claim 1, comprising:
   the metal RF line and the metal connection line disposed between a passivation layer and a substrate.

4. The system of claim 3, comprising:
   a first ground through via extending through the passivation layer, wherein the first signal through via and the first ground through via define a capacitive element.

5. The system of claim 3, the substrate comprising a molding compound.

6. The system of claim 1, comprising:
a metal line connected to the metal connection line at the third location and a bottom surface of the first signal through via in contact with the metal line; and a second metal line in contact with a top surface of the first signal through via.

7. The system of claim 1, comprising:
a bottom surface of the first signal through via in contact with the metal connection line.

8. The system of claim 1, comprising:
a first ground through via connected to a ground point, wherein the first signal through via and the first ground through via define a capacitive element.

9. The system of claim 8, the 3D RF choke comprising:
a second capacitive element comprising:
a second ground through via; and
a second signal through via connected to the metal connection line through a metal line.

10. A system for selectively filtering a radio frequency (RF) bandwidth, comprising:
a 3D RF choke configured to selectively filter the RF bandwidth, the 3D RF choke comprising:
a metal connection line configured as an inductive element, the metal connection line connecting to a DC power source at a first location of the metal connection line, the metal connection line connecting to a metal RF line at a second location of the metal connection line, the metal RF line connecting an RF input port to an RF output port; and
a capacitive element comprising:
a first ground through via connected to a ground point; and
a first signal through via connected to the metal connection line at a third location of the metal connection line.

11. The system of claim 10, the metal connection line comprising a first configuration value based upon an impedance control factor for the inductive element.

12. The system of claim 10, the third location between the first location and the second location.

13. The system of claim 10, the 3D RF choke comprising:
a second capacitive element comprising:
a second ground through via; and
a second signal through via connected to the metal connection line through a metal line.

14. The system of claim 13, the metal line configured as a first post passivation interconnection (PPI) layer formed underneath the second signal through via, and the 3D RF choke comprising:
a second PPI layer formed above the second signal through via.

15. The system of claim 14, the 3D RF choke configured according to a meandered structure, the meander structure comprising the first PPI layer, the second PPI layer, and at least one of the first signal through via, the second signal through via, the first ground through via, or the second ground through via.

16. The system of claim 14, the 3D RF choke configured according to a vertical ring structure, the vertical ring structure comprising the first signal through via, a first metal line within the first PPI layer, a second metal line within the second PPI layer, the second signal through via, and a third metal line within the first PPI layer, the third metal line connecting the second signal through via to the metal connection line, the first signal through via and the second signal through via connected by the second metal line.

17. The system of claim 10, wherein a height value, a diameter value, or a pitch value between the first ground through via and the first signal through via is based upon an impedance control factor for the capacitive element.

18. A method for forming an RF choke, comprising: forming a metal connection line between a DC power source at a first location of the metal connection line and a metal RF line at a second location of the metal connection line, the metal connection line formed as an inductive element for the RF choke;
forming a metal line connecting to the metal connection line at a third location of the metal connection line between the first location and the second location;
forming a capacitive element for the RF choke, the capacitive element comprising a first signal through via over the metal line and a first ground through via;
connecting the first ground through via to a ground point; and
connecting the first signal through via to the metal line.

19. The method of claim 18, comprising:
forming a second capacitive element for the RF choke, the second capacitive element comprising a second signal through via and a second ground through via;
connecting the second ground through via to a second ground point; and
connecting the second signal through via to the metal line.

20. The method of claim 18, comprising:
forming a first post passivation interconnection (PPI) layer underneath the first signal through via, the first PPI layer comprising the metal line; and
forming a second PPI layer above the first signal through via.

* * * * *